(12) United States Patent
Heumann

(10) Patent No.: US 6,617,941 B2
(45) Date of Patent: Sep. 9, 2003

(54) METHOD FOR DESIGNING A FILTER SYSTEM

(75) Inventor: Dirk Heumann, Nidderau (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 0 days.

(21) Appl. No.: 09/913,699
(22) PCT Filed: Dec. 19, 2000
(86) PCT No.: PCT/EP00/12959
§ 371 (c)(1),
(2), (4) Date: Jan. 2, 2002
(87) PCT Pub. No.: WO01/47107
PCT Pub. Date: Jun. 28, 2001

(65) Prior Publication Data
US 2003/0011445 A1 Jan. 16, 2003

(30) Foreign Application Priority Data
Dec. 20, 1999 (DE) .......................................... 199 61 535

(51) Int. Cl.$^7$ .............................. H03H 7/09; H03H 7/06
(52) U.S. Cl. ........................................ 333/167; 333/172
(58) Field of Search ................................ 333/167, 172, 333/175, 177, 181, 185; 307/105

(56) References Cited

U.S. PATENT DOCUMENTS 4,215,325 A * 7/1980 Sansone .................. 333/167 X
4,794,353 A * 12/1988 Broyde ........................ 333/167

FOREIGN PATENT DOCUMENTS

WO    WO 9945643    9/1999    ............ H03H/7/01
WO    WO 0028660    5/2000    ............ H03H/7/06

* cited by examiner

Primary Examiner—Seungsook Ham
(74) Attorney, Agent, or Firm—Dean W. Russell; Kilpatrick Stockton LLP

(57) ABSTRACT

A filter system includes at least two longitudinal branches with longitudinal inductors and at least one filter section (B) and an adjacent filter section (A). The filter section (B) is provided with at least one transverse branch that is interposed between the longitudinal branches, the adjacent filter section (A) adjoining the transverse branch. The number of inductors of a filter section that are wound around different magnet cores can be reduced by equivalence transformation.

25 Claims, 8 Drawing Sheets

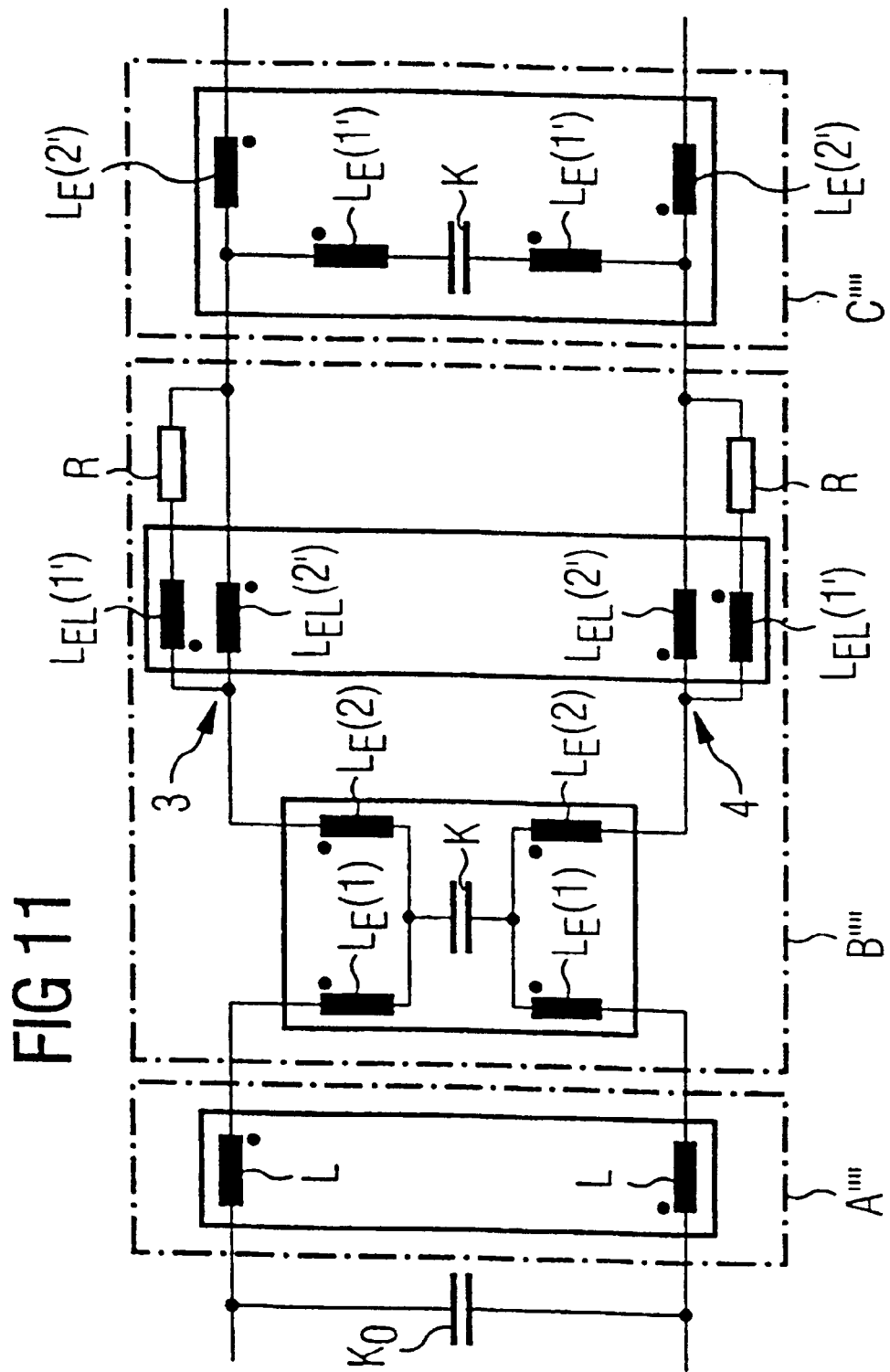

METHOD FOR DESIGNING A FILTER SYSTEM

This application claims priority to German Application No. 199 61 535.7 filed on Dec. 20, 1999 and International Application No. PCT/EP00/12959 filed on Dec. 19, 2000, the entire contents of each of which are hereby incorporated by reference.

BACKGROUND OF THE INVENTION

Design of a filter system with at least two longitudinal branches that have longitudinal inductors, and a filter arrangement with at least one filter section that has at least one transverse branch interposed between the longitudinal branches and at least one adjacent filter section that directly adjoins the transverse branch.

Such a filter system, which is suitable as a low-pass filter for an ADSL diplexer, is known from the "Handbook of Filter Synthesis" by Anatol I. Zverev, 1967, e.g., p. 59, FIG. 2.39.

A filter system with four connections has two longitudinal branches, which are symmetrically constructed. The filter system has a plurality of filter sections connected in series. The first filter section on the input side has one longitudinal inductor per longitudinal branch. The remaining filter sections, on the input side, each have a transverse branch comprising a capacitor interposed between two coupled transverse inductors and, on the output side, one longitudinal inductor per longitudinal branch. The longitudinal inductors and the transverse inductors of each filter section are coupled with each other, i.e., the inductors consist of windings that are wound around the same magnetic core. These magnetic cores are particularly costly. For each additional filter section, two additional magnetic cores are required. The more filter sections the filter system has, the more expensive it is.

In the older German Patent Application 198 51 872.2, to increase the return loss, each longitudinal inductor is replaced by two longitudinal inductors that are connected in series and are not coupled with each other. An electrical resistor is connected in parallel to one of the longitudinal inductors. This does not substantially change the transmission characteristics, such as group delay distortion.

SUMMARY OF THE INVENTION

The object of the invention is to define a method for designing a filter system, in which the filter system has fewer magnetic cores compared to the prior art, without changing the transmission characteristics.

Embodiments and further developments of the inventive concept are set forth in the dependent claims.

The method according to the invention for designing a filter system with at least two longitudinal branches that have longitudinal inductors, at least one filter section that is provided with at least one transverse branch interposed between the longitudinal branches, and at least one adjacent filter section, which directly adjoins the transverse branch, determines the arrangement of the inductors by means of a first type of transformation characterized by the following process sections:

First, the filter section has at least one free longitudinal inductor of the first longitudinal branch, a free longitudinal inductor of the second longitudinal branch coupled therewith and the transverse branch which consists of a capacitor that is interposed between two transverse inductors that are coupled together. The adjacent filter section first has at least one free longitudinal inductor of the first longitudinal branch and a free longitudinal inductor of the second longitudinal branch coupled therewith.

Subsequently, between the transverse branch and the adjacent filter section, a preliminary longitudinal inductor and a compensation inductor compensating the same and connected in series are inserted in each longitudinal branch. The preliminary longitudinal inductors are coupled with each other and the compensation inductors are coupled with each other.

Subsequently the compensation inductors are integrated into the free longitudinal inductors of the adjacent filter section.

Afterwards, the preliminary longitudinal inductors, the free longitudinal inductors of the filter section and the transverse inductors are replaced by four end inductors coupled with each other such that an equivalent circuit diagram of the four end inductors corresponds with the circuit diagram of the preliminary longitudinal inductors, the free longitudinal inductors of the filter section and the transverse inductors.

A second type of transformation provides for the following process sections:

First, the filter section has a longitudinal inductor of the first longitudinal branch, a longitudinal inductor of the second longitudinal branch coupled therewith and the transverse branch. The adjacent filter section first has at least one longitudinal inductor of the first longitudinal branch and a longitudinal inductor of the second longitudinal branch coupled therewith.

Subsequently, the longitudinal inductors of the filter section are each replaced by a first longitudinal inductor, which forms at least one part of the free longitudinal inductor, and a second longitudinal inductor connected in series therewith, to which a resistor R is connected in parallel. Corresponding longitudinal inductors belonging to the same filter section are coupled with each other.

Then, the preliminary longitudinal inductor and the compensation inductor are inserted.

A third type of transformation provides for the following process sections:

First, the filter section has a longitudinal inductor of the first longitudinal branch, a longitudinal inductor of the second longitudinal branch coupled therewith and the transverse branch. The adjacent filter section first has at least one longitudinal inductor of the first longitudinal branch and a longitudinal inductor of the second longitudinal branch coupled therewith. Subsequently, the longitudinal inductors of the filter section and the adjacent filter section are replaced, respectively, by a first longitudinal inductor and a second longitudinal inductor connected in series therewith, to which a resistor is connected in parallel. Corresponding longitudinal inductors that belong to the same filter section are coupled with each other.

Subsequently, the first longitudinal inductors and the second longitudinal inductors of the same filter section per longitudinal branch are replaced by a new first longitudinal inductor and a new second longitudinal inductor such that the new second longitudinal inductor is connected in series with the resistor. This series connection is connected in parallel to the new first longitudinal inductor. In the same filter section, the new first longitudinal inductors of the first longitudinal branch and the second longitudinal branch are coupled with each other and the new second longitudinal inductors of the first longitudinal branch and the second longitudinal branch are coupled with each other.

Afterwards, in each longitudinal branch of the filter section, an additional preliminary longitudinal inductor and an additional compensation inductor compensating the same and forming at least a portion of the free longitudinal inductor are inserted between the parallel connection of the new first longitudinal inductor to the series connection and the adjacent filter section.

Thereafter, the additional preliminary longitudinal inductors, the new first longitudinal inductors which form an additional circuit diagram, are replaced by four longitudinal end inductors that are coupled with each other, such that an equivalent circuit diagram of the four longitudinal end inductors corresponds with the additional circuit diagram.

Then, the preliminary longitudinal inductor and the compensation inductor are inserted.

A further embodiment of the invention provides for a method in which a first capacitor electrode of the capacitor is connected with a first end inductor that is connected with the adjacent filter section and with a second end inductor, in which the winding direction of the first inductor relative to the capacitor corresponds with the winding direction of the second end inductor relative to the capacitor, in which a second capacitor electrode of the capacitor is connected with a third end inductor that is connected with the adjacent filter section and with, a fourth end inductor, in which the winding direction of the first end inductor relative to the capacitor is opposite to the winding direction of the third end inductor relative to the capacitor, in which the winding direction of the third end inductor relative to the capacitor corresponds with the winding direction of the fourth end inductor relative to the capacitor.

In addition, the method according to the invention can be further developed in that a first capacitor electrode of the capacitor is connected with a first end inductor, which is connected with the adjacent filter section, a second end inductor is connected with the first end inductor and with the adjacent filter section, the winding direction of the first end inductor relative to a first reference point on the electrical connection between the first end inductor and the second end inductor is opposite to the winding direction of the second end inductor relative to the first reference point, a second capacitor electrode of the capacitor is connected with a third end inductor, which is connected with the adjacent filter section, a fourth end inductor is connected with the third end inductor and with the adjacent filter section, the winding direction of the third end inductor relative to a second reference point on the electrical connection between the third end inductor and the fourth end inductor is opposite to the winding direction of the fourth end inductor relative to the second reference point, the winding direction of the first end inductor relative to the capacitor is opposite to the winding direction of the third end inductor relative to the capacitor.

Furthermore it may be provided that a first capacitor electrode of the capacitor is connected with a second end inductor, in which the second end inductor is connected with a first end inductor which is connected with the adjacent filter section, the winding direction of the first end inductor relative to a seventh reference point on the electrical connection between the first end inductor and the second end inductor is opposite to the winding direction of the second end inductor relative to the seventh reference point, a second capacitor electrode of the capacitor is connected with a fourth end inductor, the fourth end inductor is connected with a third end inductor which is connected with the adjacent filter section, the winding direction of the third end inductor relative to a ninth reference point on the electrical connection between the third end inductor and the fourth end inductor is opposite to the winding direction of the fourth end inductor relative to the ninth reference point, and the winding direction of the first end inductor relative to the capacitor is opposite to the winding direction of the third end inductor relative to the capacitor.

Another further development provides that a first longitudinal end inductor is connected in series with the resistor of the filter section in the first longitudinal branch, and a second longitudinal end inductor is connected in parallel to this series connection, The winding direction of the first longitudinal end inductor relative to a third reference point on the electrical connection between the first longitudinal end inductor and the second longitudinal end inductor is opposite to the winding direction of the second longitudinal end inductor relative to the third reference point, a third longitudinal end inductor is connected in series with resistor R of the filter section in the second longitudinal branch and a fourth longitudinal end inductor is connected in parallel to this series connection, the winding direction of the third longitudinal end inductor relative to a fourth reference point on the electrical connection is between the third longitudinal end inductor and the fourth longitudinal end inductor relative to the fourth reference point, the winding direction of the first longitudinal end inductor relative to the transverse branch is opposite to the winding direction of the third longitudinal end inductor relative to the transverse branch.

Alternatively, it may be provided that a first longitudinal end inductor is connected in series with a second longitudinal end inductor to which resistor R of the filter section in the first longitudinal branch is connected in parallel, the winding direction of the first longitudinal end inductor relative to a fifth reference point on the electrical connection between the first longitudinal end inductor and the second longitudinal end inductor corresponds with the winding direction of the second longitudinal end inductor relative to the fifth reference point, a third longitudinal end inductor with a fourth longitudinal end inductor to which the resistor of the filter section in the second longitudinal branch is connected in parallel, the winding direction of the third longitudinal end inductor relative to a sixth reference point on the electrical connection between the third longitudinal end inductor and the fourth longitudinal end inductor corresponds with the winding direction of the fourth longitudinal end inductor relative to the sixth reference point, the winding direction of the first longitudinal end inductor relative to the transverse branch is opposite to the winding direction of the third longitudinal end inductor relative to the transverse branch.

Another alternative is characterized in that a second longitudinal end inductor and a resistor of the filter section in the first longitudinal branch are connected in series, in which an electrical connection is connected in parallel to the series connection comprised of the second longitudinal end inductor and the resistor, a first longitudinal end inductor is interposed between the adjacent filter section and the series connection comprised of the second longitudinal end inductor and the resistor, the winding direction of the first longitudinal end inductor relative to an eighth reference point on the electrical connection between the first longitudinal end inductor and the second longitudinal end inductor corresponds with the winding direction of the second longitudinal end inductor relative to the eight reference point, a fourth longitudinal end inductor and a resistor of the filter section in the first longitudinal branch are connected in series, in which an electrical connection is connected in parallel to the series connection comprising the fourth longitudinal end inductor and the resistor, a third longitudinal end inductor is interposed between the adjacent filter section and the series connection comprised of the fourth longitudinal end inductor and the resistor, the winding direction of the third longitudinal end inductor relative to a tenth reference point on the electrical connection between the third longitudinal end inductor and the fourth longitudinal end inductor corresponds with the winding direction of the fourth longitudinal end inductor relative to the tenth reference point, and the winding direction of the first longitudinal end inductor relative to the transverse branch is opposite to the winding direction of the third longitudinal end inductor relative to the transverse branch.

Finally, one embodiment of the invention may consist in that at least one additional filter section adjacent to the filter section is provided, and the compensation inductor for the transformation of the additional adjacent filter section are integrated into the free longitudinal inductors of the filter section.

Accordingly, the procedure should, for example, be as follows. First, the filter section has at least one free longitudinal inductor of the first longitudinal branch, a free longitudinal inductor of the second longitudinal branch coupled therewith, and the transverse branch, which consists of a capacitor interposed between two transverse inductors which are coupled with each other. The term "free longitudinal inductor" denotes a longitudinal inductor to which no additional component is connected in parallel. The adjacent filter section first has at least one free longitudinal inductor of the first longitudinal branch and a free longitudinal inductor of the second longitudinal branch coupled therewith. This initial state corresponds to a filter arrangement of the prior art. For transformation, a preliminary longitudinal inductor and a compensation inductor compensating the same and connected in series therewith are then inserted into each longitudinal branch between the transverse branch and the adjacent filter section. The preliminary inductors are coupled with each other and the compensation inductors are also coupled with each other. The circuit characteristics of the filter system thus transformed remain the same, since the preliminary longitudinal inductor is compensated by the compensation inductor. For further transformation, the compensation inductors are then integrated into the free longitudinal inductors of the adjacent filter section. Thereafter, the preliminary longitudinal inductors, the free longitudinal inductors of the filter section, and the transverse inductors are replaced by four end inductors that are coupled with each other such that an equivalent circuit diagram of the four end inductors corresponds with the circuit diagram of the preliminary longitudinal inductors, the free longitudinal inductors of the filter section and the transverse inductors.

Since the four end inductors are coupled with each other, said four end inductors consist of windings that are wound around the same magnetic core.

The described transformation makes it possible to save one magnetic core for each filter section that has a transverse branch, since the free inductors and the transverse inductors, for which the two magnetic cores are required, are transformed in such a way that only one magnetic core is required.

The described transformation is an equivalence transformation, so that the circuit characteristics of the filter configuration, such as group delay distortion and transfer function, are preserved in the transformation. A filter system designed according to the invention consequently has fewer magnetic cores compared to the prior art without any change in the circuit characteristics of the filter system.

BRIEF DESCRIPTION OF THE DRAWINGS

FIGS. 7–11 illustrate various filter arrangements with multiple filter sections.

DETAILED DESCRIPTION

Figure 1A:
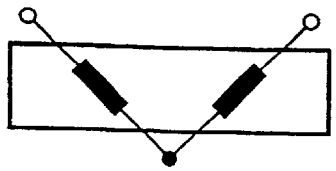
FIGS. 1a, 1b, and 1c detail three transformed basic circuits.
Figure 1B:
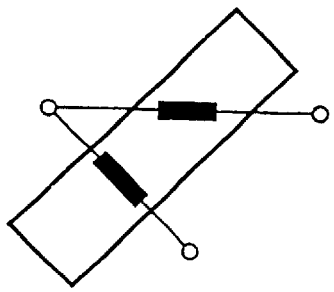
Figure 1C:
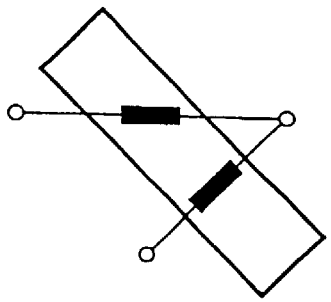

The transformation will now be described in greater detail. The longitudinal branches of a filter system are typically arranged in pairs and symmetrical to each other, with corresponding inductors of the longitudinal branches of a pair being coupled to each other. Due to this symmetrical construction, it is sufficient to look at only one longitudinal branch when describing the transformation:

Three transformed basic circuits are depicted in FIGS. 1a, 1b and 1c. They have the same equivalent circuit diagram, which is shown in FIG. 2a.

Figure 2A:
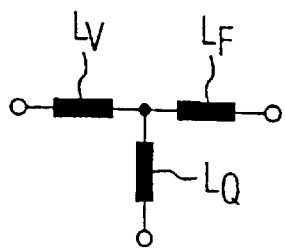
FIGS. 2a and 2b illustrate equivalent circuit diagrams.

The equivalent circuit diagram shown in FIG. 2a corresponds to a portion of a filter arrangement according to the prior art, in which the preliminary inductor $L_v$ has been inserted. The preliminary inductor $L_V$ is connected with the free longitudinal inductor $L_F$ and the transverse inductor $L_Q$. From this equivalent circuit diagram, with suitable transformation, one obtains the three transformed basic circuits. Each of the basic circuits comprises two inductors that are coupled with each other. The coupling in FIGS. 1a, 1b, 1c is made clear by the framing of the inductors that are coupled with each other. For the transformation, the value of the preliminary longitudinal inductor $L_V$ has to obey the following equation:

$$L_V = -\frac{L_F \cdot L_Q}{L_F + L_Q}$$

Figure 2B:
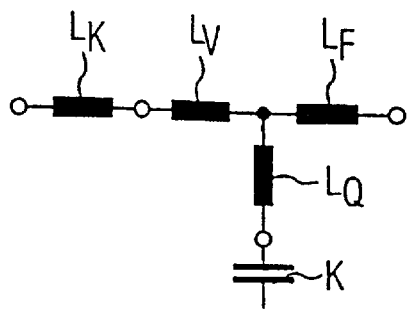

In a filter arrangement according to the prior art, each filter section per longitudinal branch has only the free longitudinal inductor $L_F$. Consequently, to realize the equivalent circuit diagram, the preliminary longitudinal inductor $L_V$ must be inserted. To preserve the circuit characteristics, a compensation inductor $L_K$ compensating said preliminary longitudinal inductor $L_V$ must therefore also be inserted. For the sake of clarity, capacitor K of the transverse branch is also depicted in FIG. 2b. That is depicted in FIG. 2b. The following applies:

$$L_V = -L_K$$

Figure 3A:
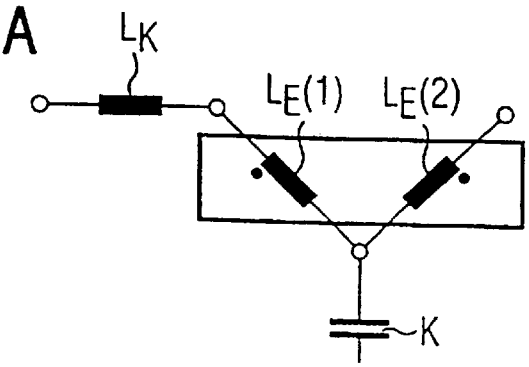
FIGS. 3a, 3b, and 3c show circuit diagrams comprising transformations of the equivalent circuit diagram of FIG. 2b.

In a transformation of the equivalent circuit diagram depicted in FIG. 2b relative to the basic circuit depicted in FIG. 1a, one obtains the circuit diagram shown in FIG. 3a. This transformation is hereinafter referred to as the first transformation. The compensation inductor $L_K$ requires no additional magnetic core, since due to the series connection with the free longitudinal inductor of the adjacent filter section, it can be integrated into the free longitudinal inductor of the adjacent filter section, i.e., it can be combined into a single inductor. Since only the transformation of one longitudinal branch was depicted, only two of the four end inductors are shown in FIG. 3a.

The capacitor K is connected with a first end inductor $L_E$ (1), which is connected with the adjacent filter section, and with a second end inductor $L_E$ (2). The fact that the two end inductors are distinguished by (1) and (2) and not by the index makes it clear that the two end inductors $L_E$ (1), $L_E$ (2) are different inductors but that they are coupled with each other. The following applies:

$$L_E(1) = \frac{L_Q^2}{L_F + L_Q}$$

$$L_E(2) = L_F + L_Q$$

The winding direction of the first end inductor $L_E$ (1) relative to the capacitor K corresponds with the winding direction of the second end inductor $L_E$ (2) relative to the capacitor K. This is represented by the dots on the end inductors $L_E$ (1), $L_E$ (2). Instead of both being at the top, the dots can also both be at the bottom. The absolute winding direction is not important, only the winding directions relative to each other.

The longitudinal branches of a pair are symmetrically constructed in such a way that the winding direction of the first end inductor $L_E$ (1) relative to the capacitor K is opposite to the winding direction of a third end inductor, which corresponds with the first end inductor $L_E$ (1), relative to the capacitor K.

Figure 3B:
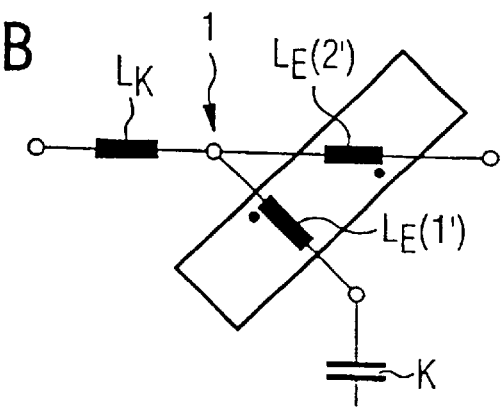

In a transformation based on the equivalent circuit diagram depicted in FIG. 2b relative to the basic circuit shown in FIG. 1b, the circuit diagram depicted in FIG. 3b is obtained. This transformation is hereinafter referred to as the second transformation. The capacitor K is connected with the first end inductor $L_E$ (1'), which is connected with the adjacent filter section. The second end inductor $L_E$ (2') is connected with the first end inductor $L_E$ (1') and with the adjacent filter section but not with the capacitor K. The following applies:

$$L_E(1') = \frac{L_Q^2}{L_F + L_Q} \qquad L_E(2') = \frac{L_F^2}{L_F + L_Q}$$

The winding direction of the first end inductor $L_E$ (1') relative to a first reference point 1 on the electrical connection between the first end inductor $L_E$ (1') and the second end inductor $L_E$ (2') is opposite to the winding direction of the second end inductor $L_E$ (2') relative to the first reference point 1. The winding directions are again indicated by the dots on the end inductors $L_E$ (1'), $L_E$ (2'). Here, too, only the relative winding directions are important, i.e., the dot on the first end inductor $L_E$ (1') can be at the bottom instead of the top if the dot in the second end inductor $L_E$ (2') is to the left instead of to the right.

The longitudinal branches of a pair are constructed symmetrically to each other such that the winding direction of the first end inductor $L_E$ (1') relative to the capacitor K is opposite to the winding direction of a third end inductor that corresponds to the first end inductor relative to the capacitor K.

Figure 3C:
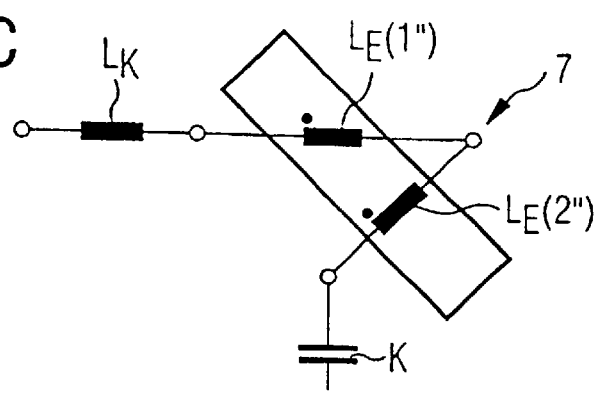

In a transformation based on the equivalent circuit diagram shown in FIG. 2b relative to the third basic circuit depicted in FIG. 1c, the circuit diagram shown in FIG. 3c is obtained. This transformation is hereinafter referred to as the third transformation. The capacitor K is connected with the second end inductor $L_E$ (2"). The second end inductor $L_E$ (2") is connected with the first end inductor $L_E$ (1"), which is connected with the adjacent filter section. The following applies:

$$L_E(1'') = \frac{L_F^2}{L_F + L_Q} \qquad L_E(2'') = L_F + L_Q$$

The winding direction of the first end inductor $L_E$ (1") relative to a seventh reference point 7 on the electrical connection between the first end inductor $L_E$ (1") and the second end inductor $L_E$ (2") is opposite to the winding direction of the second end inductor $L_E$ (2") relative to the seventh reference point 7. The winding directions are again indicated by means of dots on the end inductors $L_E$ (1"), $L_E$ (2"). Here, too, only the relative winding direction is important, i.e., the dot on the first end inductor $L_E$ (1") can be on the left instead of the right if the dot on the second end inductor $L_E$ (2") is at the top instead of at the bottom.

To increase the return loss of the filter system, it is advantageous to replace a longitudinal inductor L of the first longitudinal branch and a longitudinal inductor of the second longitudinal branch of the same filter section coupled therewith by, respectively, a first longitudinal inductor $L_1$ and a second longitudinal inductor $L_2$ connected in series therewith, to which a resistor R is connected in parallel. The corresponding longitudinal inductors that belong to the same filter section are coupled with each other (see FIG. 4). Thus, the two first longitudinal inductors $L_1$ are coupled with each other and the two second longitudinal inductors $L_2$ are coupled with each other. This passive transformation makes it possible to adapt the filter configuration to a complex terminating resistor, so that the return loss is significantly increased compared to a filter system without passive transformation.

Without passive transformation, the free longitudinal inductor $L_F$ is, for example, equal to the longitudinal inductor L.

With passive transformation, the free longitudinal inductor $L_F$ is, for example, the first longitudinal inductor L1.

The free longitudinal inductor $L_F$ can always be composed of a longitudinal inductor L or a first longitudinal inductor $L_1$ and a compensation inductor, which is created by transformation of an additional filter section adjacent to the filter section.

Figure 4:
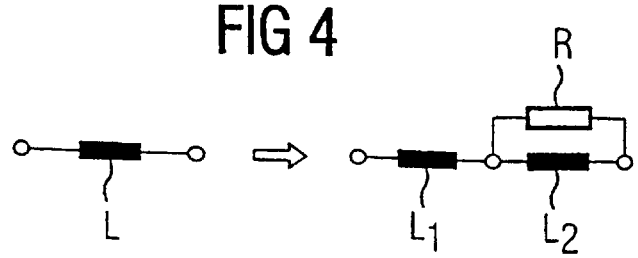
FIG. 4 depicts coupling of longitudinal inductors of the same filter section.
Figure 5A:
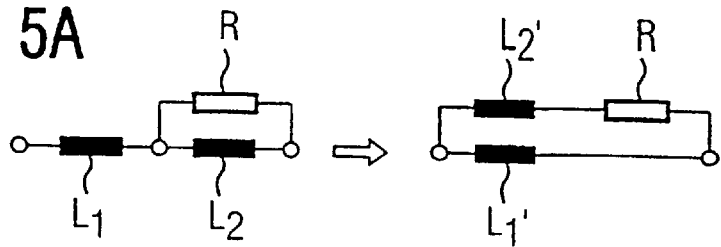
FIGS. 5a and 5b address parallel transformation of filters.

The result shown in FIG. 4 of the passive transformation can be further transformed corresponding to the transformations of the transverse branch. To this end, after the passive transformation, a parallel transformation is first performed. This transformation is shown in FIG. 5a. The first longitudinal inductors $L_1$ and the second longitudinal inductors $L_2$ of the same filter section per longitudinal branch are replaced by a new first longitudinal inductor $L_1'$ and a new second longitudinal inductor $L_2'$ such that the new second longitudinal inductor $L_2'$ is connected in series with resistor R. This series connection is connected in parallel to the new first longitudinal inductor $L_1'$. In the same filter section the new first longitudinal inductors $L_1'$ of the first longitudinal branch and the second longitudinal branch are coupled with each other. Furthermore, the new second longitudinal inductors $L_2'$ of the first longitudinal branch and the second longitudinal branch in the same filter section are coupled with each other.

Figure 5B:
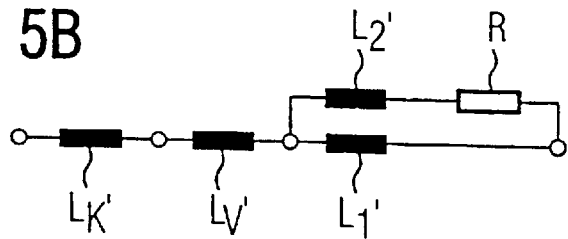

To produce a corresponding equivalent circuit diagram relative to the equivalent circuit diagram shown in FIG. 2b, an additional preliminary longitudinal inductor $L_v'$ and an additional compensation inductor $L_K'$ compensating the same are inserted between the above-described parallel connection and the adjacent filter section (see FIG. 5b). The additional compensation inductor $L_K'$ forms at least a portion of the free longitudinal inductor $L_F$ of the filter section. The following applies:

$$L_K' = \frac{L_2' \cdot L_1'}{L_2' + L_1'}$$

Figure 6A:
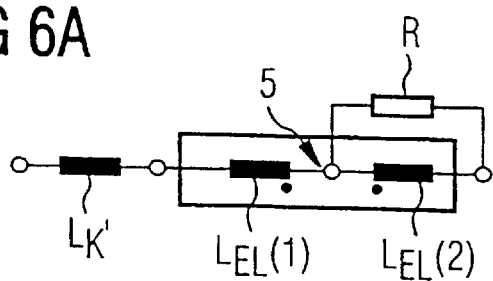
FIGS. 6a, 6b, and 6c show diagrams comprising transformations of the arrangement of FIG. 5B.

To perform a first transformation according to FIG. 1a, the additional preliminary longitudinal inductors $L_v'$, the new first longitudinal inductors $L_1'$ and the new second longitudinal inductors $L_2'$ are replaced by four end inductors $L_{EL}$ (1), $L_{EL}$ (2), which are coupled with each other, in such a way that an equivalent circuit diagram of the longitudinal end inductors $L_{EL}$ (1), $L_{EL}$ (2) corresponds with a circuit diagram that is formed by the preliminary longitudinal inductors $L_v'$, the new first longitudinal inductors $L_1'$ and the new second longitudinal inductors $L_2'$ (see FIG. 6a).

The first longitudinal end inductor $L_{EL}$ (1) is connected in series with the second end longitudinal inductor $L_{EL}$ (2) to which resistor R of the filter section is connected in parallel. The following applies:

$$L_{EL}(1) = \frac{L_2'}{L_2' + L_1'}$$

$$L_{EL}(2) = L_2' + L_1'$$

The winding direction of the first longitudinal end inductor $L_{EL}$ (1) relative to a fifth reference point 5 on the electrical connection between the first longitudinal end inductor $L_{EL}$ (1) and the second longitudinal end inductor $L_{EL}$ (2) corresponds with the winding direction of the second end inductor $L_{EL}$ (2) relative to the fifth reference point 5. Here, too, only the relative winding direction is important.

Figure 6B:
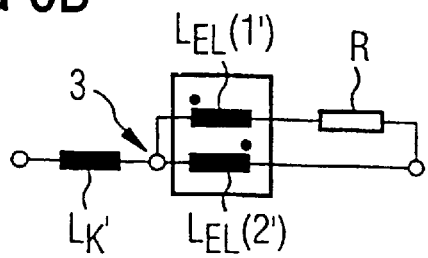
Figure 6C:
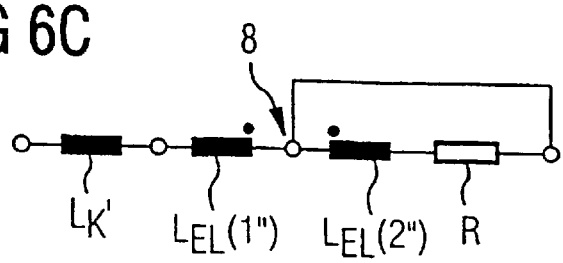

Starting from the parallel-transformed filter arrangement of FIG. 5b, for example the transformation according to FIG. 1b, i.e., the second transformation, can also be performed. This gives the filter configuration depicted in FIG. 6b. A first longitudinal end inductor $L_{EL}$ (1') is connected in series with resistor R of the filter section in the first longitudinal branch. A second longitudinal end inductor $L_{EL}$ (2') is connected in parallel to this series connection. The following applies:

$$L_{EL}(1') = \frac{L_2'^2}{L_1' + L_2'} \qquad L_{EL}(2') = \frac{L_1'^2}{L_1' + L_2'}$$

The winding direction of the first longitudinal end inductor $L_{EL}$ (1') relative to a third reference point 3 on the electrical connection between the first longitudinal end inductor $L_{EL}$ (1') and the second longitudinal end inductor $L_{EL}$ (2') is opposite to the winding direction of the second longitudinal end inductor $L_{EL}$ (2') relative to the third reference point 3. Here, too, only the relative winding direction is important.

Based on the parallel-transformed filter configuration of FIG. 5b, for example the third transformation according to FIG. 1c can also be performed. A second longitudinal end inductor $L_{EL}$ (2") and a resistor R are connected in series. An electrical connection is connected in parallel to the series connection comprised of the second longitudinal end inductor $L_{EL}$ (2") and the resistor R. A first longitudinal end inductor $L_{EL}$ (1") is connected with the series connection comprised of the second longitudinal end inductor $L_{EL}$ (2") and the resistor R.

The following applies:

$$L_{EL}(1")=L_2'+L_1'$$

$$L_{EL}(2")=L_1'^2/(L_2'+L_1')$$

The winding direction of the first longitudinal end inductor $L_{EL}(1")$ relative to an eighth reference point 8 on the electrical connection between the first longitudinal end inductor $L_{EL}(1')$ and the second longitudinal end inductor $L_{EL}$ (2') corresponds with the winding direction of the second longitudinal end inductor $L_{EL}$ (2") relative to the eighth reference point 8. Here, too, only the relative winding direction is important.

Preferably, more than two filter sections are provided.

Figure 7:
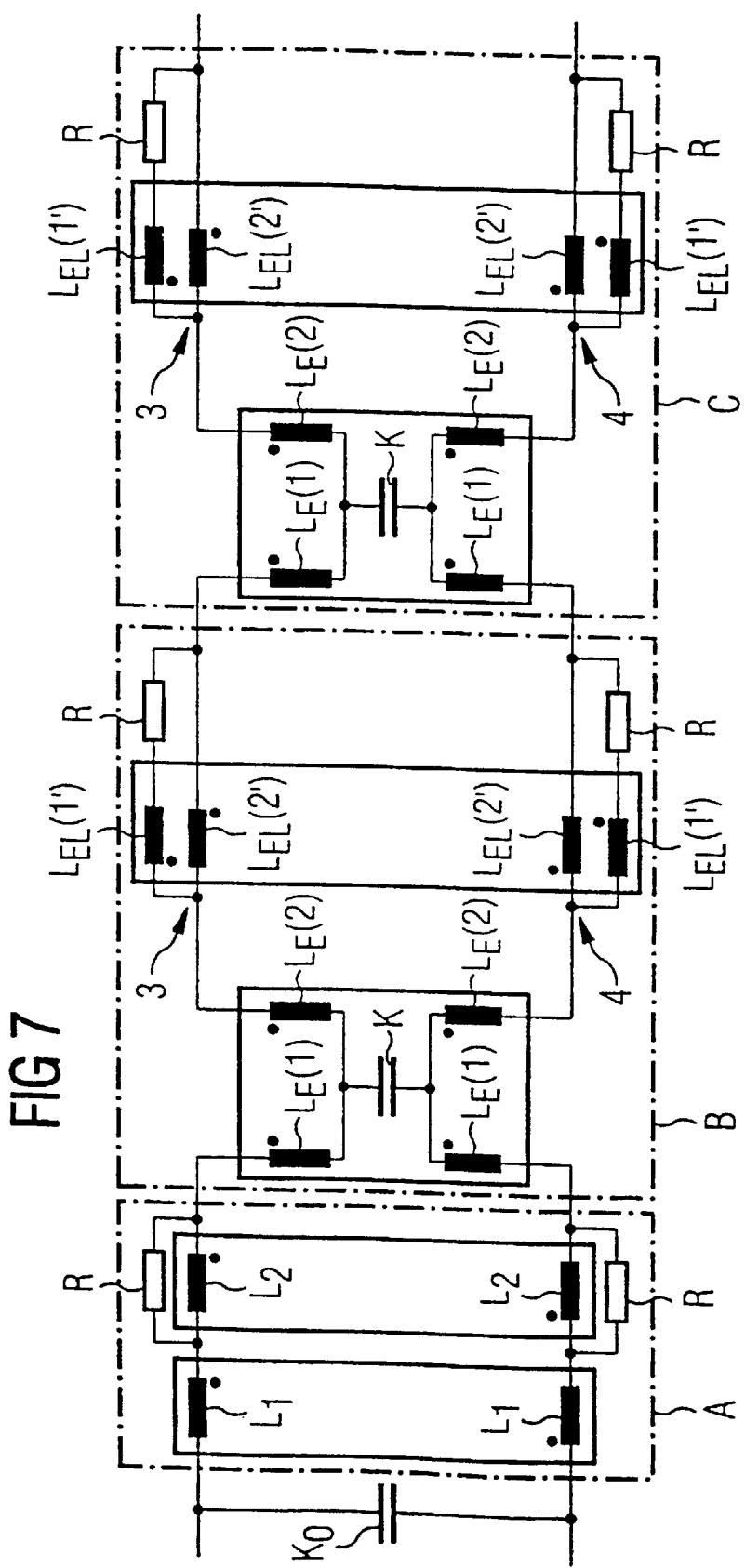

FIG. 7 shows a filter arrangement with a first filter section A, a second filter section B and a third filter section C. The transverse branches of the filter arrangement follow from the first transformations. The longitudinal inductors of the second section B and the third section C follow from the second transformations with prior passive transformation and parallel transformation. The longitudinal inductors of the first filter section A have been subjected to a passive transformation to increase the return loss. The values of the inductors, resistors and capacitors are shown in Table 1. The winding directions of the first longitudinal end inductor $L_{EL}$ (1') and the second longitudinal end inductor $L_{EL}$ (2') of the second filter section B in the upper longitudinal branch are opposite to each other relative to the third reference point 3. The third reference point 3 lies on the electrical connection between the first longitudinal end inductor $L_{EL}$ (1') and the second longitudinal end inductor $L_{EL}$ (2'). This is true, correspondingly, for the longitudinal end inductors $L_{EL}$ (1'), $L_{EL}$ (2') of the third filter section C in the upper longitudinal branch. It is true, correspondingly, for the longitudinal end inductors $L_{EL}$ (1'), $L_{EL}$ (2') of the second filter section B or the third filter section C in the lower longitudinal branch relative to a fourth reference point 4.

TABLE 1

| Component | Section | Value |
|---|---|---|
| K0 | 0 | 6.8 nF |
| $L_1$ | A | 763 μH |
| $L_2$ | A | 2598 μH |
| 2*$R_T$ | A | 27.5 ohm |
| $L_E$ (1) | B | 5.7 μH |
| $L_E$ (2) | B | 907 μH |
| K | B | 11.7 nF |
| $L_{EL}$ (1') | B | 235 μH |
| $L_{EL}$ (2') | B | 2974 μH |
| 2*R | B | 51.7 ohm |
| $L_E$ (1) | C | 3.6 μH |
| $L_E$ (2) | C | 462 μH |
| K | C | 10.5 nF |
| $L_{EL}$ (1') | C | 113 μH |
| $L_{EL}$ (2') | C | 1569 μH |
| 2*R | C | 26.7 ohm |

Figure 8:
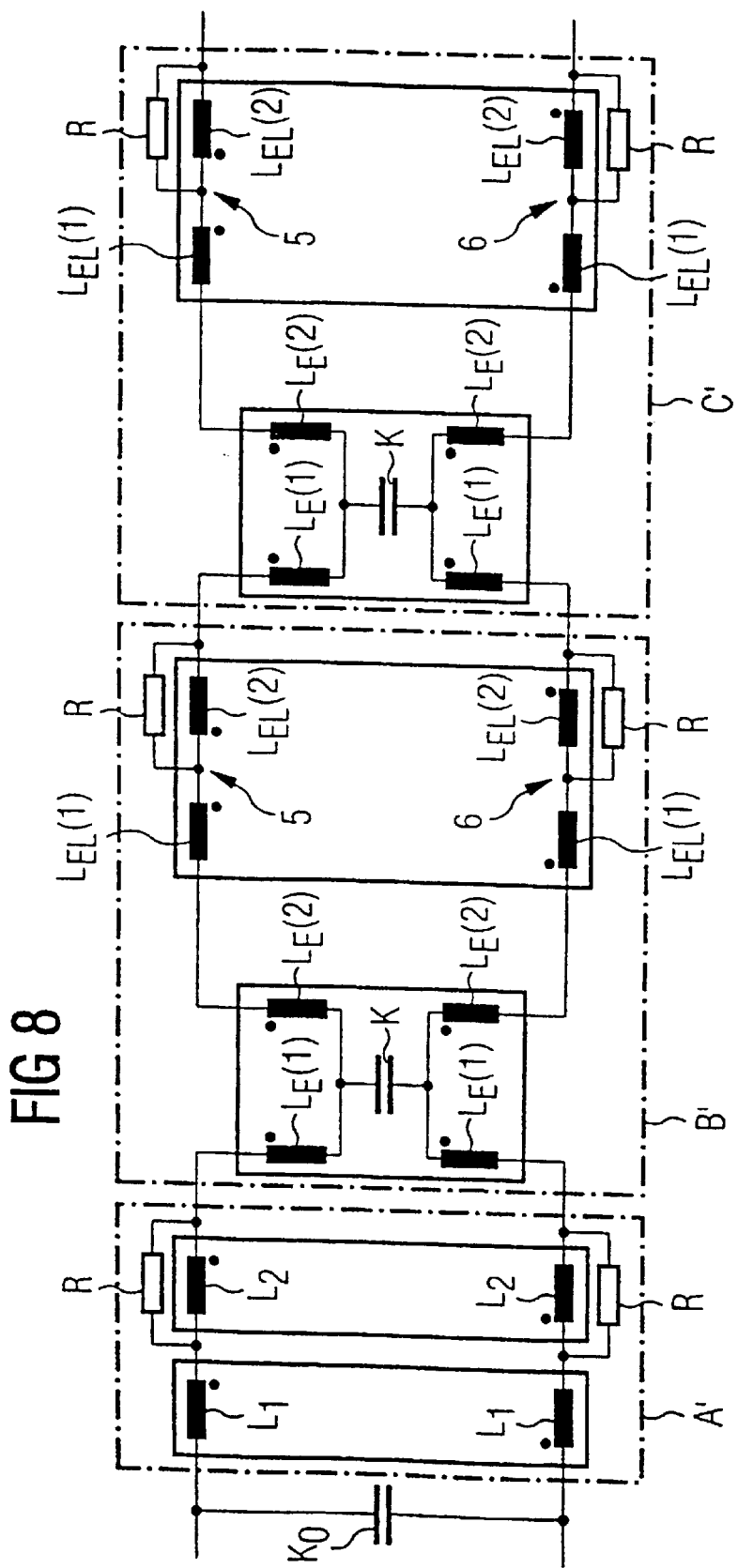

FIG. 8 shows a filter arrangement with a first filter section A', a second filter section B' and a third filter section C' in which the transverse branches follow from a first transformation, the longitudinal inductors of the second section B' and the third section C' likewise follow from a first transformation with prior passive transformation and parallel transformation, and the longitudinal inductors of the first section follow from a passive transformation. The values of the inductors, resistors and capacitors are shown in Table 2. The winding direction of the first longitudinal end inductor $L_{EL}$ (1) and the second longitudinal end inductor $L_{EL}$ (2) of the second filter section B' in the upper longitudinal branch correspond with each other with respect to the fifth reference point 5. The fifth reference point 5 lies on the electrical connection between the first longitudinal end inductor $L_{EL}$ (1) and the second longitudinal end inductor $L_{EL}$ (2). This is true, correspondingly, for the longitudinal end inductors $L_{EL}$ (1), $L_{EL}$ (2) of the third filter section C' in the upper longitudinal branch. It is true, correspondingly, for the longitudinal end inductors $L_{EL}$ (1), $L_{EL}$ (2) of the second filter section B' or the third filter section C' in the lower longitudinal branch relative to a sixth reference point 6.

TABLE 2

| Component | Section | Value |
|---|---|---|
| K0 | 0 | 6.8 nF |
| $L_1$ | A' | 763 μH |
| $L_2$ | A' | 2598 μH |
| 2*R | A' | 27.5 ohm |
| $L_E$ (1) | B' | 5.7 μH |
| $L_E$ (2) | B' | 907 μH |
| K | B' | 11.7 nF |
| $L_{EL}$ (1) | B' | 235 μH |
| $L_{EL}$ (2) | B' | 4881 μH |
| 2*R | B' | 51.7 ohm |
| $L_E$ (1) | C' | 3.6 μH |
| $L_E$ (2) | C' | 462 μH |
| K | C' | 10.5 nF |
| $L_{EL}$ (1) | C' | 113 μH |

TABLE 2-continued

| Component | Section | Value |
|---|---|---|
| $L_{EL}$ (2) | C' | 2524 μH |
| 2*R | C' | 26.7 ohm |

It is also within the scope of the invention not to transform all of the inductors and not to transform all of the filter sections.

It is within the scope of the invention to subject different transverse branches of the same filter arrangement to different transformations. The same applies to the longitudinal inductors.

Figure 9:
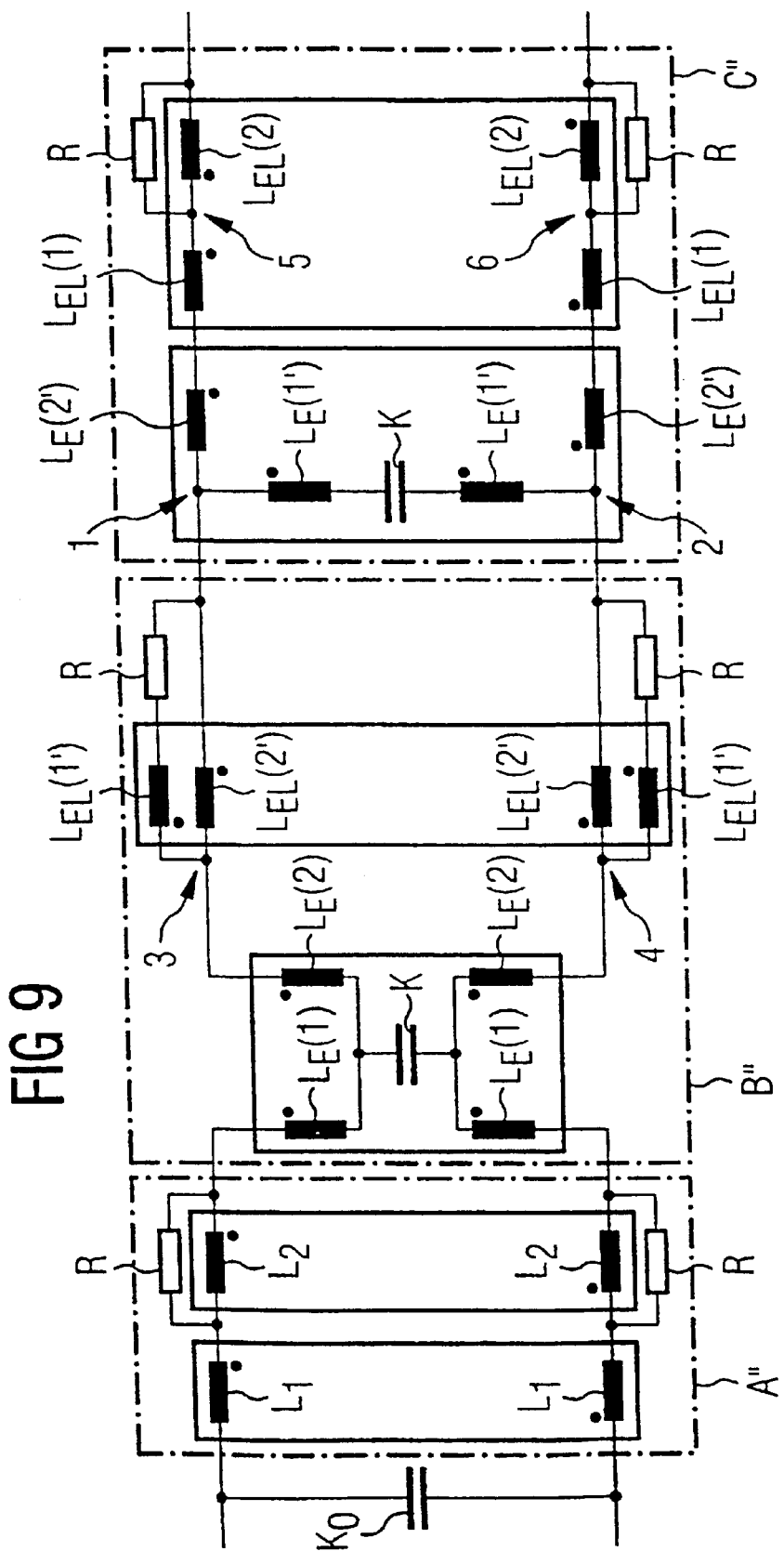

FIG. 9 shows a filter system with a first filter section A", a second filter section B" and a third filter section C", in which the transverse branch of the second filter section B" and the longitudinal inductors of the third filter section C" follow from a first transformation, and the transverse branch of the third filter section C" and the longitudinal inductors of the second filter section B" follow from a second transformation. The longitudinal inductors were previously subjected to a passive transformation and a parallel transformation. The longitudinal inductors of the first section follow from a passive transformation. The values of the inductors, resistors and capacitors are shown in Table 3. The winding directions of the first end inductor $L_E$ (1') and the second end inductor $L_E$ (2') of the third filter section C" in the upper longitudinal branch are opposite to each other relative to the first reference point 1. The first reference point 1 lies on the electrical connection between the first end inductor $L_E$ (1') and the second end inductor $L_E$ (2'). This is true, correspondingly, for the respective end inductors $L_E$ (1'), $L_E$ (2') in the lower longitudinal branch relative to a second reference point 2.

TABLE 3

| Component | Section | Value |
|---|---|---|
| K0 | 0 | 6.8 nF |
| $L_1$ | A" | 763 μH |
| $L_2$ | A" | 2598 μH |
| 2*R | A" | 27.5 ohm |
| $L_E$ (1) | B" | 5.7 μH |
| $L_E$ (2) | B" | 907 μH |
| K | B" | 11.7 nF |
| $L_{EL}$ (1') | B" | 235 μH |
| $L_{EL}$ (2') | B" | 2974 μH |
| 2*R | B" | 51.7 ohm |
| $L_E$ (1') | C" | 384 μH |
| $L_E$ (2') | C" | 3.6 μH |
| K | C" | 10.5 nF |
| $L_{EL}$ (1) | C" | 113 μH |
| $L_{EL}$ (2) | C" | 2524 μH |
| 2*R | C" | 26.7 ohm |

Figure 10:
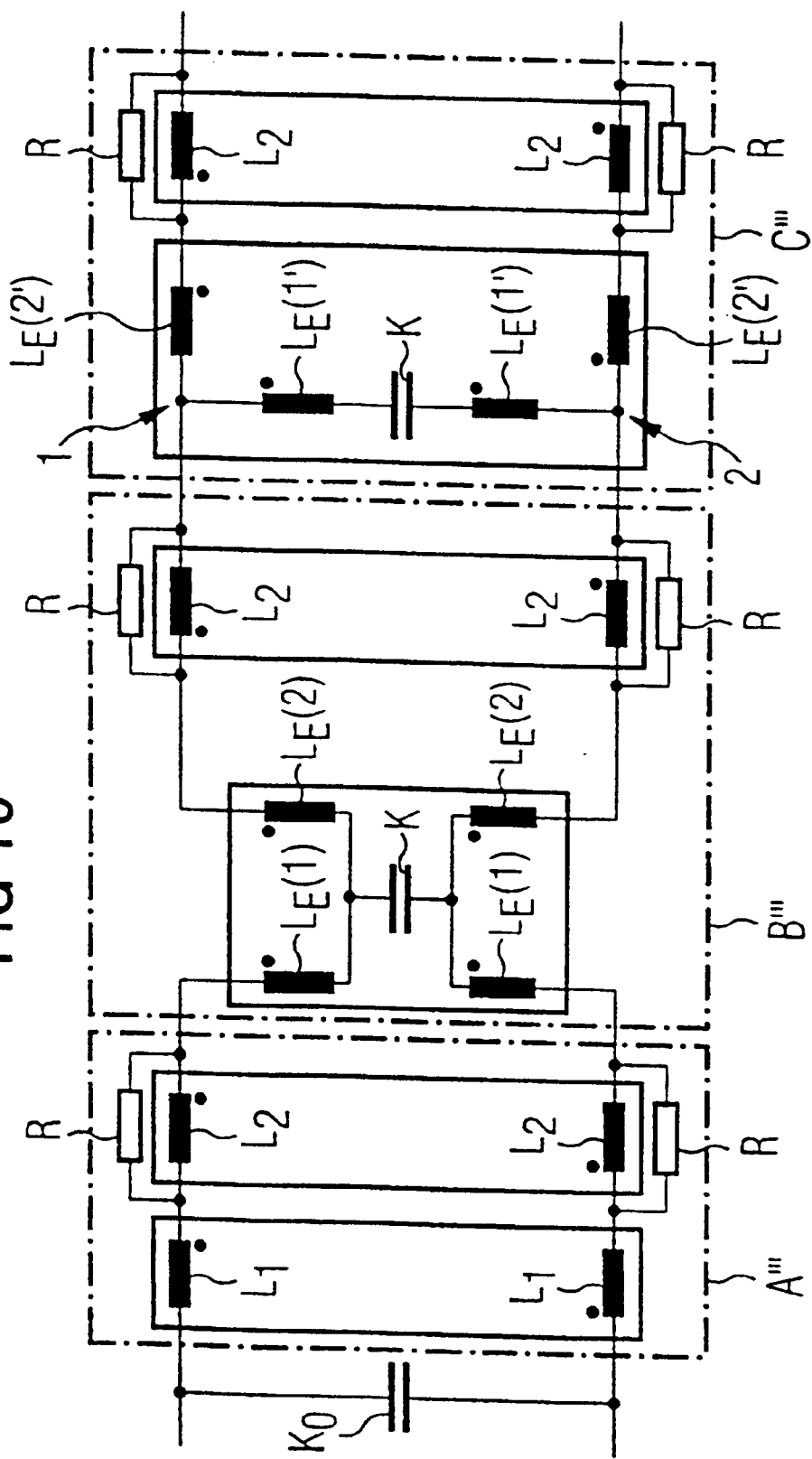

FIG. 10 shows a filter arrangement with a first filter section A''', a second filter section B''' and a third filter section C''', in which the transverse branch of the second filter section B''' follows from a first transformation, and the transverse branch of the third filter section C''' follows from a second transformation. The longitudinal inductors of all three filter sections A''', B''', C''' follow from a passive transformation. The values of the inductors, resistors and capacitors are shown in Table 4.

TABLE 4

| Component | SectionSection | Value |
|---|---|---|
| K0 | 0 | 6.8 nF |
| L₁ | A''' | 763 μH |
| L₂ | A''' | 2598 μH |
| 2*R | A''' | 27.5 ohm |
| L_E (1) | B''' | 5.7 μH |
| L_E (2) | B''' | 907 μH |
| K | B''' | 11.7 nF |
| L₂ | B''' | 2974 μH |
| 2*R | B''' | 31.5 ohm |
| L_E (1') | C''' | 384 μH |
| L_E (2') | C''' | 3.6 μH |
| K | C''' | 10.5 nF |
| L₂ | C''' | 1569 μH |
| 2*R | C''' | 16.6 ohm |

FIG. 11 shows a filter system with a first filter section A'''', a second filter section B'''' and a third filter section C'''', in which the transverse branch of the second filter section B'''' follows from a first transformation, and the transverse branch of the third filter section C'''' follows from a second transformation. The longitudinal inductors of the second filter section B'''' follow from a passive transformation, a parallel transformation and a subsequent second transformation. The longitudinal inductors of the first filter section A'''' and the third filter section C'''' were not transformed. The values of the inductors, resistors and capacitors are shown in Table 5.

TABLE 5

| Component | Section | Value |
|---|---|---|
| K0 | 0 | 6.8 nF |
| L | 1 | 1016.3 μH |
| L_E (1) | 2 | 5.7 μH |
| L_E (2) | 2 | 907 μH |
| K | 2 | 11.7 μF |
| L_EL (1') | 2 | 2974 μH |
| L_EL (2') | 2 | 235.1 μH |
| 2*R | 2 | 51.7 ohm |
| L_E (1') | 3 | 535.6 μH |
| L_E (2') | 3 | 2.74 μH |
| K | 3 | 10.5 nF |

When calculating the values of the inductors, it is recommended, prior to transformation of the filter section, first to transform an additional filter section adjacent to the filter section, whose transverse branch directly adjoins the filter section, and subsequently to transform the filter section. In this way, the compensation inductor inserted in the transformation of the additional adjacent filter section can be integrated into the free longitudinal inductor of the filter section and taken into account immediately in the transformation of the filter section.

What is claimed is:

1. A method for designing a filter system with
at least two longitudinal branches having longitudinal inductors,
at least one filter section, which has at least one transverse branch interposed between the longitudinal branches, and
at least one adjacent filter section, which adjoins the transverse branch,
wherein the configuration of the inductors is determined by means of transformation by the following process steps:
first, the filter section has at least one free longitudinal inductor of the first longitudinal branch, a free longitudinal inductor of the second longitudinal branch coupled therewith and the transverse branch, which consists of a capacitor that is interposed between two transverse inductors coupled with each other, and first the adjacent filter section has at least one free longitudinal inductor of the first longitudinal branch and a free longitudinal inductor of the second longitudinal branch coupled therewith,
subsequently, in each longitudinal branch between the transverse branch and the adjacent filter section a preliminary longitudinal inductor and a compensating inductor compensating the same and connected in series therewith are inserted, wherein the preliminary longitudinal inductors are coupled with each other and the compensation inductors are coupled with each other,
subsequently, the compensation inductors are integrated into the free longitudinal inductors of the adjacent filter step,
subsequently, the preliminary longitudinal inductors, the free longitudinal inductors of the filter section and the transverse inductors are replaced by four end inductors that are coupled with each other such that an equivalent circuit diagram of the four end inductors corresponds with the circuit diagram of the preliminary longitudinal inductors, the free longitudinal inductors of the filter section and the transverse inductors.

2. A method for designing a filter system with at least two longitudinal branches having longitudinal inductors,
at least one filter section, which has at least one transverse branch interposed between the longitudinal branches, and
at least one adjacent filter section, which adjoins the transverse branch,
wherein the configuration of the inductors is determined by means of transformation by the following process steps:
first, the filter section has a longitudinal inductor of the first longitudinal branch, a longitudinal inductor of the second longitudinal branch coupled therewith and the transverse branch, and the adjacent filter section first has at least one longitudinal inductor of the first longitudinal branch and a longitudinal inductor of the second longitudinal branch coupled therewith,
subsequently, the longitudinal inductors of the filter section are replaced, respectively, by a first longitudinal inductor, which forms at least a portion of the free longitudinal inductor, and a second longitudinal inductor connected in series therewith, to which a resistor R is connected in parallel, wherein corresponding longitudinal inductors that belong to the same filter section are coupled with each other, and
subsequently, a preliminary longitudinal inductor and a compensation inductor are inserted.

3. A method for designing a filter system with at least two longitudinal branches having longitudinal inductors,
at least one filter section, which has at least one transverse branch interposed between the longitudinal branches, and
at least one adjacent filter section, which adjoins the transverse branch,
wherein the configuration of the inductors is determined by means of transformation by the following process steps:

first, the filter section has a longitudinal inductor of the first longitudinal branch, a longitudinal inductor of the second longitudinal branch coupled therewith and the transverse branch, and the adjacent filter section first has at least one longitudinal inductor of the first longitudinal branch and a longitudinal inductor of the second longitudinal branch coupled therewith, subsequently, the longitudinal inductors of the filter section and the adjacent filter section are replaced, respectively, by a first longitudinal inductor and a second longitudinal inductor connected in series therewith, to which a resistor is connected in parallel, wherein corresponding longitudinal inductors that belong to the same filter section are coupled with each other, subsequently, the first longitudinal inductors and the second longitudinal inductors of the same filter section per longitudinal branch are replaced by a new first longitudinal inductor and a new second longitudinal inductor such that the new second longitudinal inductor is connected in series with the resistor, said series connection is connected in parallel to the new first longitudinal inductor, in the same filter section the new first longitudinal inductors of the first longitudinal branch and the second longitudinal branch are coupled with each other and the new second longitudinal inductors of the first longitudinal branch and the second longitudinal branch are coupled with each other, subsequently, in each longitudinal branch of the filter section a preliminary longitudinal inductor and a compensation inductor compensating the same and forming at least a portion of the free longitudinal inductor, are inserted between the parallel connection of the new first longitudinal inductor to the series connection and the adjacent filter section, and subsequently, the preliminary longitudinal inductors, the new first longitudinal inductors, which form an additional circuit diagram, are replaced by four longitudinal end inductors that are coupled with each other, such that an equivalent circuit diagram of the four longitudinal end inductors corresponds with the additional circuit diagram.

4. The method as claimed in claim 1,
in which a first capacitor electrode of the capacitor is connected with a first end inductor that is connected with the adjacent filter section and with a second end inductor,
in which the winding direction of the first end inductor relative to the capacitor corresponds with the winding direction of the second end inductor relative to the capacitor,
in which a second capacitor electrode of the capacitor is connected with a third end inductor that is connected with the adjacent filter section and with a fourth end inductor,
in which the winding direction of the first end inductor relative to the capacitor is opposite to the winding direction of the third end inductor relative to the capacitor,
in which the winding direction of the third end inductor relative to the capacitor corresponds with the winding direction of the fourth end inductor relative to the capacitor.

5. The method as claimed in claim 1,
in which a first capacitor electrode of the capacitor is connected with a first end inductor, which is connected with the adjacent filter section,
in which a second end inductor is connected with the first end inductor and with the adjacent filter section,
in which the winding direction of the first end inductor relative to a first reference point on the electrical connection between the first end inductor and the second end inductor is opposite to the winding direction of the second end inductor relative to the first reference point,
in which a second capacitor electrode of the capacitor is connected with a third end inductor, which is connected with the adjacent filter section,
in which a fourth end inductor is connected with the third end inductor and with the adjacent filter section,
in which the winding direction of the third end inductor relative to a second reference point on the electrical connection between the third end inductor and the fourth end inductor is opposite to the winding direction of the fourth end inductor relative to the second reference point,
in which the winding direction of the first end inductor relative to the capacitor is opposite to the winding direction of the third end inductor relative to the capacitor.

6. The method as claimed in claim 1,
in which a first capacitor electrode of the capacitor is connected with a second end inductor,
in which the second end inductor is connected with a first end inductor, which is connected with the adjacent filter section,
in which the winding direction of the first end inductor relative to a seventh reference point on the electrical connection between the first end inductor and the second end inductor is opposite to the winding direction of the second end inductor relative to the seventh reference point,
in which a second capacitor electrode of the capacitor is connected with a fourth end inductor,
in which the fourth end inductor is connected with a third end inductor that is connected with the adjacent filter section,
in which the winding direction of the third end inductor relative to a ninth reference point on the electrical connection between the third end inductor and the fourth end inductor is opposite to the winding direction of the fourth end inductor relative to the ninth reference point,
in which the winding direction of the first end inductor relative to the capacitor is opposite to the winding direction of the third end inductor relative to the capacitor.

7. The method as claimed in claim 3,
in which a first longitudinal end inductor is connected in series with the resistor of the filter section in the first longitudinal branch, and a second longitudinal end inductor is connected in parallel to said series connection,
in which the winding direction of the first longitudinal end inductor relative to a third reference point on the electrical connection between the first longitudinal end inductor and the second longitudinal end inductor is opposite to the winding direction of the second longitudinal end inductor relative to the third reference point, in which a third longitudinal end inductor is connected in series with the resistor of the filter section in the second longitudinal branch, and a fourth longitudinal end inductor is connected in parallel to said series connection, in which the winding direction of the third longitudinal end inductor relative to a fourth reference point on the electrical connection is between the third longitudinal end inductor and the fourth longitudinal end inductor relative to the fourth reference point, in which the winding direction of the first longitudinal end inductor relative to the transverse branch is opposite to the winding direction of the third longitudinal end inductor relative to the transverse branch.

8. The method as claimed in claim 3, in which a first longitudinal end inductor is connected in series with a second longitudinal end inductor, to which the resistor of the filter section in the first longitudinal branch is connected in parallel, in which the winding direction of the first longitudinal end inductor relative to a fifth reference point on the electrical connection between the first longitudinal end inductor and the second longitudinal end inductor corresponds with the winding direction of the second longitudinal end inductor relative to the fifth reference point, in which a third longitudinal end inductor with a fourth longitudinal end inductor to which the resistor of the filter section in the second longitudinal branch is connected in parallel, in which the winding direction of the third longitudinal end inductor relative to a sixth reference point on the electrical connection between the third longitudinal end inductor and the fourth longitudinal end inductor corresponds with the winding direction of the fourth longitudinal end inductor relative to the sixth reference point, in which the winding direction of the first longitudinal end inductor relative to the transverse branch is opposite to the winding direction of the third longitudinal end inductor relative to the transverse branch.

9. The method as claimed in claim 3, in which a second longitudinal end inductor and a resistor of the filter section in the first longitudinal branch are connected in series, in which an electrical connection is connected in parallel to the series connection comprised of the second longitudinal end inductor and the resistor, in which a first longitudinal end inductor is interposed between the adjacent filter section and the series connection comprised of the second longitudinal end inductor and the resistor, in which the winding direction of the first longitudinal end inductor relative to an eighth reference point on the electrical connection between the first longitudinal end inductor and the second longitudinal end inductor corresponds with the winding direction of the second longitudinal end inductor relative to the eighth reference point, in which a fourth longitudinal end inductor and a resistor of the filter section in the first longitudinal branch are connected in series, in which an electrical connection is connected in parallel to the series connection comprised of the fourth longitudinal end inductor and the resistor, in which a third longitudinal end inductor is interposed between the adjacent filter section and the series connection comprised of the fourth longitudinal end inductor and the resistor, in which the winding direction of the third longitudinal end inductor relative to a tenth reference point on the electrical connection between the third longitudinal end inductor and the fourth longitudinal end inductor corresponds with the winding direction of the fourth longitudinal end inductor relative to the tenth reference point, in which the winding direction of the first longitudinal end inductor relative to the transverse branch is opposite to the winding direction of the third longitudinal end inductor relative to the transverse branch.

10. The method as claimed in claim 1, in which at least one additional filter section is provided adjacent to filter section, in which the compensation inductor for the transformation of the additional adjacent filter section are integrated into the free longitudinal inductors of the filter section.

11. The method as claimed in claim 2, in which a first capacitor electrode of the capacitor is connected with a first end inductor that is connected with the adjacent filter section and with a second end inductor, in which the winding direction of the first end inductor relative to the capacitor corresponds with the winding direction of the second end inductor relative to the capacitor, in which a second capacitor electrode of the capacitor is connected with a third end inductor that is connected with the adjacent filter section and with a fourth end inductor, in which the winding direction of the first end inductor relative to the capacitor is opposite to the winding direction of the third end inductor relative to the capacitor, in which the winding direction of the third end inductor relative to the capacitor corresponds with the winding direction of the fourth end inductor relative to the capacitor.

12. The method as claimed in claim 3, in which a first capacitor electrode of the capacitor is connected with a first end inductor that is connected with the adjacent filter section and with a second end inductor, in which the winding direction of the first end inductor relative to the capacitor corresponds with the winding direction of the second end inductor relative to the capacitor, in which a second capacitor electrode of the capacitor is connected with a third end inductor that is connected with the adjacent filter section and with a fourth end inductor, in which the winding direction of the first end inductor relative to the capacitor is opposite to the winding direction of the third end inductor relative to the capacitor, in which the winding direction of the third end inductor relative to the capacitor corresponds with the winding direction of the fourth end inductor relative to the capacitor.

13. The method as claimed in claim 2,
in which a first capacitor electrode of the capacitor is connected with a first end inductor, which is connected with the adjacent filter section,
in which a second end inductor is connected with the first end inductor and with the adjacent filter section,
in which the winding direction of the first end inductor relative to a first reference point on the electrical connection between the first end inductor and the second end inductor is opposite to the winding direction of the second end inductor relative to the first reference point,
in which a second capacitor electrode of the capacitor is connected with a third end inductor, which is connected with the adjacent filter section,
in which a fourth end inductor is connected with the third end inductor and with the adjacent filter section,
in which the winding direction of the third end inductor relative to a second reference point on the electrical connection between the third end inductor and the fourth end inductor is opposite to the winding direction of the fourth end inductor relative to the second reference point,
in which the winding direction of the first end inductor relative to the capacitor is opposite to the winding direction of the third end inductor relative to the capacitor.

14. The method as claimed in claim 3,
in which a first capacitor electrode of the capacitor is connected with a first end inductor, which is connected with the adjacent filter section,
in which a second end inductor is connected with the first end inductor and with the adjacent filter section,
in which the winding direction of the first end inductor relative to a first reference point on the electrical connection between the first end inductor and the second end inductor is opposite to the winding direction of the second end inductor relative to the first reference point,
in which a second capacitor electrode of the capacitor is connected with a third end inductor, which is connected with the adjacent filter section,
in which a fourth end inductor is connected with the third end inductor and with the adjacent filter section,
in which the winding direction of the third end inductor relative to a second reference point on the electrical connection between the third end inductor and the fourth end inductor is opposite to the winding direction of the fourth end inductor relative to the second reference point,
in which the winding direction of the first end inductor relative to the capacitor is opposite to the winding direction of the third end inductor relative to the capacitor.

15. The method as claimed in claim 2,
in which a first capacitor electrode of the capacitor is connected with a second end inductor,
in which the second end inductor is connected with a first end inductor, which is connected with the adjacent filter section,
in which the winding direction of the first end inductor relative to a seventh reference point on the electrical connection between the first end inductor and the second end inductor is opposite to the winding direction of the second end inductor relative to the seventh reference point,
in which a second capacitor electrode of the capacitor is connected with a fourth end inductor,
in which the fourth end inductor is connected with a third end inductor that is connected with the adjacent filter section,
in which the winding direction of the third end inductor relative to a ninth reference point on the electrical connection between the third end inductor and the fourth end inductor is opposite to the winding direction of the fourth end inductor relative to the ninth reference point,
in which the winding direction of the first end inductor relative to the capacitor is opposite to the winding direction of the third end inductor relative to the capacitor.

16. The method as claimed in claim 3,
in which a first capacitor electrode of the capacitor is connected with a second end inductor,
in which the second end inductor is connected with a first end inductor, which is connected with the adjacent filter section,
in which the winding direction of the first end inductor relative to a seventh reference point on the electrical connection between the first end inductor and the second end inductor is opposite to the winding direction of the second end inductor relative to the seventh reference point,
in which a second capacitor electrode of the capacitor is connected with a fourth end inductor,
in which the fourth end inductor is connected with a third end inductor that is connected with the adjacent filter section,
in which the winding direction of the third end inductor relative to a ninth reference point on the electrical connection between the third end inductor and the fourth end inductor is opposite to the winding direction of the fourth end inductor relative to the ninth reference point,
in which the winding direction of the first end inductor relative to the capacitor is opposite to the winding direction of the third end inductor relative to the capacitor.

17. The method as claimed in claim 11,
in which a first longitudinal end inductor is connected in series with the resistor of the filter section in the first longitudinal branch, and a second longitudinal end inductor is connected in parallel to said series connection,
in which the winding direction of the first longitudinal end inductor relative to a third reference point on the electrical connection between the first longitudinal end inductor and the second longitudinal end inductor is opposite to the winding direction of the second longitudinal end inductor relative to the third reference point,
in which a third longitudinal end inductor is connected in series with the resistor of the filter section in the second longitudinal branch, and a fourth longitudinal end inductor is connected in parallel to said series connection,
in which the winding direction of the third longitudinal end inductor relative to a fourth reference point on the electrical connection is between the third longitudinal end inductor and the fourth longitudinal end inductor relative to the fourth reference point, in which the winding direction of the first longitudinal end inductor relative to the transverse branch is opposite to the winding direction of the third longitudinal end inductor relative to the transverse branch.

18. The method as claimed in claim 13, in which a first longitudinal end inductor is connected in series with the resistor of the filter section in the first longitudinal branch, and a second longitudinal end inductor is connected in parallel to said series connection, in which the winding direction of the first longitudinal end inductor relative to a third reference point on the electrical connection between the first longitudinal end inductor and the second longitudinal end inductor is opposite to the winding direction of the second longitudinal end inductor relative to the third reference point, in which a third longitudinal end inductor is connected in series with the resistor of the filter section in the second longitudinal branch, and a fourth longitudinal end inductor is connected in parallel to said series connection, in which the winding direction of the third longitudinal end inductor relative to a fourth reference point on the electrical connection is between the third longitudinal end inductor and the fourth longitudinal end inductor relative to the fourth reference point, in which the winding direction of the first longitudinal end inductor relative to the transverse branch is opposite to the winding direction of the third longitudinal end inductor relative to the transverse branch.

19. The method as claimed in claim 15, in which a first longitudinal end inductor is connected in series with the resistor of the filter section in the first longitudinal branch, and a second longitudinal end inductor is connected in parallel to said series connection, in which the winding direction of the first longitudinal end inductor relative to a third reference point on the electrical connection between the first longitudinal end inductor and the second longitudinal end inductor is opposite to the winding direction of the second longitudinal end inductor relative to the third reference point, in which a third longitudinal end inductor is connected in series with the resistor of the filter section in the second longitudinal branch, and a fourth longitudinal end inductor is connected in parallel to said series connection, in which the winding direction of the third longitudinal end inductor relative to a fourth reference point on the electrical connection is between the third longitudinal end inductor and the fourth longitudinal end inductor relative to the fourth reference point, in which the winding direction of the first longitudinal end inductor relative to the transverse branch is opposite to the winding direction of the third longitudinal end inductor relative to the transverse branch.

20. The method as claimed in claim 11, in which a first longitudinal end inductor is connected in series with a second longitudinal end inductor, to which the resistor of the filter section in the first longitudinal branch is connected in parallel, in which the winding direction of the first longitudinal end inductor relative to a fifth reference point on the electrical connection between the first longitudinal end inductor and the second longitudinal end inductor corresponds with the winding direction of the second longitudinal end inductor relative to the fifth reference point, in which a third longitudinal end inductor with a fourth longitudinal end inductor to which the resistor of the filter section in the second longitudinal branch is connected in parallel, in which the winding direction of the third longitudinal end inductor relative to a sixth reference point on the electrical connection between the third longitudinal end inductor and the fourth longitudinal end inductor corresponds with the winding direction of the fourth longitudinal end inductor relative to the sixth reference point, in which the winding direction of the first longitudinal end inductor relative to the transverse branch is opposite to the winding direction of the third longitudinal end inductor relative to the transverse branch.

21. The method as claimed in claim 13, in which a first longitudinal end inductor is connected in series with a second longitudinal end inductor, to which the resistor of the filter section in the first longitudinal branch is connected in parallel, in which the winding direction of the first longitudinal end inductor relative to a fifth reference point on the electrical connection between the first longitudinal end inductor and the second longitudinal end inductor corresponds with the winding direction of the second longitudinal end inductor relative to the fifth reference point, in which a third longitudinal end inductor with a fourth longitudinal end inductor to which the resistor of the filter section in the second longitudinal branch is connected in parallel, in which the winding direction of the third longitudinal end inductor relative to a sixth reference point on the electrical connection between the third longitudinal end inductor and the fourth longitudinal end inductor corresponds with the winding direction of the fourth longitudinal end inductor relative to the sixth reference point, in which the winding direction of the first longitudinal end inductor relative to the transverse branch is opposite to the winding direction of the third longitudinal end inductor relative to the transverse branch.

22. The method as claimed in claim 15, in which a first longitudinal end inductor is connected in series with a second longitudinal end inductor, to which the resistor of the filter section in the first longitudinal branch is connected in parallel, in which the winding direction of the first longitudinal end inductor relative to a fifth reference point on the electrical connection between the first longitudinal end inductor and the second longitudinal end inductor corresponds with the winding direction of the second longitudinal end inductor relative to the fifth reference point, in which a third longitudinal end inductor with a fourth longitudinal end inductor to which the resistor of the filter section in the second longitudinal branch is connected in parallel, in which the winding direction of the third longitudinal end inductor relative to a sixth reference point on the electrical connection between the third longitudinal end inductor and the fourth longitudinal end inductor corresponds with the winding direction of the fourth longitudinal end inductor relative to the sixth reference point, in which the winding direction of the first longitudinal end inductor relative to the transverse branch is opposite to the winding direction of the third longitudinal end inductor relative to the transverse branch.

23. The method as claimed in claim 11, in which a second longitudinal end inductor and a resistor of the filter section in the first longitudinal branch are connected in series, in which an electrical connection is connected in parallel to the series connection comprised of the second longitudinal end inductor and the resistor, in which a first longitudinal end inductor is interposed between the adjacent filter section and the series connection comprised of the second longitudinal end inductor and the resistor, in which the winding direction of the first longitudinal end inductor relative to an eighth reference point on the electrical connection between the first longitudinal end inductor and the second longitudinal end inductor corresponds with the winding direction of the second longitudinal end inductor relative to the eighth reference point, in which a fourth longitudinal end inductor and a resistor of the filter section in the first longitudinal branch are connected in series, in which an electrical connection is connected in parallel to the series connection comprised of the fourth longitudinal end inductor and the resistor, in which a third longitudinal end inductor is interposed between the adjacent filter section and the series connection comprised of the fourth longitudinal end inductor and the resistor, in which the winding direction of the third longitudinal end inductor relative to a tenth reference point on the electrical connection between the third longitudinal end inductor and the fourth longitudinal end inductor corresponds with the winding direction of the fourth longitudinal end inductor relative to the tenth reference point, in which the winding direction of the first longitudinal end inductor relative to the transverse branch is opposite to the winding direction of the third longitudinal end inductor relative to the transverse branch.

24. The method as claimed in claim 13, in which a second longitudinal end inductor and a resistor of the filter section in the first longitudinal branch are connected in series, in which an electrical connection is connected in parallel to the series connection comprised of the second longitudinal end inductor and the resistor, in which a first longitudinal end inductor is interposed between the adjacent filter section and the series connection comprised of the second longitudinal end inductor and the resistor, in which the winding direction of the first longitudinal end inductor relative to an eighth reference point on the electrical connection between the first longitudinal end inductor and the second longitudinal end inductor corresponds with the winding direction of the second longitudinal end inductor relative to the eighth reference point, in which a fourth longitudinal end inductor and a resistor of the filter section in the first longitudinal branch are connected in series, in which an electrical connection is connected in parallel to the series connection comprised of the fourth longitudinal end inductor and the resistor, in which a third longitudinal end inductor is interposed between the adjacent filter section and the series connection comprised of the fourth longitudinal end inductor and the resistor, in which the winding direction of the third longitudinal end inductor relative to a tenth reference point on the electrical connection between the third longitudinal end inductor and the fourth longitudinal end inductor corresponds with the winding direction of the fourth longitudinal end inductor relative to the tenth reference point, in which the winding direction of the first longitudinal end inductor relative to the transverse branch is opposite to the winding direction of the third longitudinal end inductor relative to the transverse branch.

25. The method as claimed in claim 15, in which a second longitudinal end inductor and a resistor of the filter section in the first longitudinal branch are connected in series, in which an electrical connection is connected in parallel to the series connection comprised of the second longitudinal end inductor and the resistor, in which a first longitudinal end inductor is interposed between the adjacent filter section and the series connection comprised of the second longitudinal end inductor and the resistor, in which the winding direction of the first longitudinal end inductor relative to an eighth reference point on the electrical connection between the first longitudinal end inductor and the second longitudinal end inductor corresponds with the winding direction of the second longitudinal end inductor relative to the eighth reference point, in which a fourth longitudinal end inductor and a resistor of the filter section in the first longitudinal branch are connected in series, in which an electrical connection is connected in parallel to the series connection comprised of the fourth longitudinal end inductor and the resistor, in which a third longitudinal end inductor is interposed between the adjacent filter section and the series connection comprised of the fourth longitudinal end inductor and the resistor, in which the winding direction of the third longitudinal end inductor relative to a tenth reference point on the electrical connection between the third longitudinal end inductor and the fourth longitudinal end inductor corresponds with the winding direction of the fourth longitudinal end inductor relative to the tenth reference point, in which the winding direction of the first longitudinal end inductor relative to the transverse branch is opposite to the winding direction of the third longitudinal end inductor relative to the transverse branch.

* * * * *